(12) United States Patent
Varghese et al.

(10) Patent No.: US 11,462,546 B2
(45) Date of Patent: Oct. 4, 2022

(54) DYNAMIC RANDOM ACCESS DEVICE INCLUDING TWO-DIMENSIONAL ARRAY OF FIN STRUCTURES

(71) Applicant: Varian Semiconductor Equipment Associates, Inc., Gloucester, MA (US)

(72) Inventors: Sony Varghese, Manchester, MA (US); Naushad Variam, Marblehead, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 38 days.

(21) Appl. No.: 16/778,591

(22) Filed: Jan. 31, 2020

(65) Prior Publication Data

US 2020/0168612 A1    May 28, 2020

Related U.S. Application Data

(62) Division of application No. 15/803,283, filed on Nov. 3, 2017, now Pat. No. 10,607,999.

(51) Int. Cl.
*H01L 27/108* (2006.01)
*H01L 21/308* (2006.01)
(Continued)

(52) U.S. Cl.
CPC ........ *H01L 27/10876* (2013.01); *H01J 37/32* (2013.01); *H01L 21/3086* (2013.01);
(Continued)

(58) Field of Classification Search
CPC ........... H01L 27/10876; H01L 21/3086; H01L 21/31116; H01L 27/10823;
(Continued)

(56) References Cited

U.S. PATENT DOCUMENTS 8,629,048 B1   1/2014   Sipani et al.
9,368,484 B1   6/2016   Chen et al.
(Continued)

FOREIGN PATENT DOCUMENTS

JP   2011014750 A   1/2011
JP   2011151061 A   8/2011
(Continued)

OTHER PUBLICATIONS

International Search Report and Written Opinion for the International Patent Application No. PCT/US2018/057064, dated Mar. 19, 2019, 9 pages.

(Continued)

*Primary Examiner* — Thao X Le
*Assistant Examiner* — Laura M Dykes
(74) *Attorney, Agent, or Firm* — KDB Firm PLLC (57) ABSTRACT

A method may include providing a substrate, the substrate comprising a substrate base and a patterning stack, disposed on the substrate base. The substrate may include first linear structures in the patterning stack, the first linear structures being elongated along a first direction; and second linear structures in the patterning stack, the second linear structures being elongated along a second direction, the second direction forming a non-zero angle with respect to the first direction. The method may also include selectively forming a set of sidewall spacers on one set of sidewalls of the second linear structures.

14 Claims, 8 Drawing Sheets

(51) Int. Cl.
  *H01L 29/66* (2006.01)
  *H01J 37/32* (2006.01)
  *H01L 21/311* (2006.01)
  *H01L 29/78* (2006.01)
(52) U.S. Cl.
  CPC .. *H01L 21/31116* (2013.01); *H01L 27/10823* (2013.01); *H01L 27/10826* (2013.01); *H01L 27/10879* (2013.01); *H01L 29/665* (2013.01); *H01J 37/32357* (2013.01); *H01J 37/32422* (2013.01); *H01L 29/785* (2013.01)
(58) Field of Classification Search
  CPC ......... H01L 27/10826; H01L 27/10879; H01L 29/665; H01L 29/785; H01L 27/108; H01L 25/0657; H01L 29/66007; H01J 37/32; H01J 37/32357; H01J 37/32422
  USPC ......................................................... 257/296
  See application file for complete search history.

(56) References Cited

U.S. PATENT DOCUMENTS

| | | | |
|---|---|---|---|
| 9,786,653 | B1 | 10/2017 | Ker et al. |
| 2004/0002203 | A1 | 1/2004 | Deshpande et al. |
| 2006/0197131 | A1 | 9/2006 | Yoon et al. |
| 2008/0113483 | A1* | 5/2008 | Wells ................. H01L 27/0207 438/424 |
| 2008/0197394 | A1 | 8/2008 | Caspary et al. |
| 2010/0148236 | A1 | 6/2010 | Kadoya |
| 2011/0021027 | A1 | 1/2011 | Johnson |
| 2011/0079836 | A1 | 4/2011 | Lin |
| 2012/0126338 | A1* | 5/2012 | Juengling ......... H01L 27/10879 257/401 |
| 2012/0309165 | A1* | 12/2012 | Nan ................. H01L 27/10876 438/424 |
| 2013/0323920 | A1 | 12/2013 | Chang et al. |
| 2014/0117566 | A1* | 5/2014 | Choi ................. H01L 27/10847 257/776 |
| 2014/0327087 | A1* | 11/2014 | Kim ................. H01L 27/10826 257/392 |
| 2015/0170927 | A1 | 6/2015 | Cheng et al. |
| 2015/0179501 | A1* | 6/2015 | Jhaveri ............... H01L 27/0924 257/506 |
| 2016/0155739 | A1* | 6/2016 | Ting .................... H01L 29/6656 438/283 |
| 2017/0047335 | A1 | 2/2017 | Choi et al. |

FOREIGN PATENT DOCUMENTS

| | | |
|---|---|---|
| JP | 2013201173 A | 10/2013 |
| JP | 2014086719 A | 5/2014 |
| JP | 2014160802 A | 9/2014 |
| JP | 2016033968 A | 3/2016 |
| KR | 10-1147523 B1 | 5/2012 |
| KR | 10-2014-0125534 A | 10/2014 |
| KR | 10-2017-0020434 A | 2/2017 |
| KR | 10-2017-0043683 A | 4/2017 |
| WO | 2016093087 A1 | 6/2016 |

OTHER PUBLICATIONS

"Using in-design physical verification to reduce tapeout schedules"; Authors:Tadahiko Yamamoto, Norikazu Ooishi, Kerstin McKay, 8 pages, (https://www.design-reuse.com/articles/24046/in-design-physical-verification.html).

* cited by examiner

DYNAMIC RANDOM ACCESS DEVICE INCLUDING TWO-DIMENSIONAL ARRAY OF FIN STRUCTURES

CROSS-REFERENCE TO RELATED APPLICATIONS

This is a divisional of pending U.S. non-provisional patent application Ser. No. 15/803,283, filed Nov. 3, 2017, the entire contents of the applications incorporated by reference herein.

FIELD

The present embodiments relate to semiconductor substrates, and more particularly, to processing for dynamic random access device.

BACKGROUND

As dynamic random access memory (DRAM) devices scale to smaller dimensions, an increasing emphasis is placed on patterning for forming three dimensional structures, including trenches for storage nodes as well as access transistors. In present day DRAM devices, transistors may be formed using narrow and tall semiconductor fin structures, often made from monocrystalline silicon. In accordance with predicted trends, the aspect ratio of such fin structures, meaning the height (depth) of a fin divided by the spacing between adjacent fins, may reach 20:1 or more in the coming years. Moreover, the absolute dimensions of such fin structures within the plane of a substrate are so small wherein the fin structures are not readily patternable using known deep ultraviolet lithography tools.

With respect to these and other considerations, the present disclosure is provided.

BRIEF SUMMARY

In one embodiment, a method may include providing a substrate, the substrate comprising a substrate base and a patterning stack, disposed on the substrate base. The substrate may include first linear structures in the patterning stack, the first linear structures being elongated along a first direction; and second linear structures in the patterning stack, the second linear structures being elongated along a second direction, the second direction forming a non-zero angle with respect to the first direction. The method may also include selectively forming a set of sidewall spacers on one set of sidewalls of the second linear structures.

In another embodiment, a method of fabricating a dynamic random access memory may include providing a substrate, the substrate comprising a substrate base and a patterning stack, disposed on the substrate base. The method may further include forming a first pattern, comprising first linear structures in the patterning stack, the first linear structures being elongated along a first direction, and forming a second pattern, comprising second linear structures in the patterning stack, the second linear structures being elongated along a second direction, the second direction forming a non-zero angle with respect to the first direction. The method may also include selectively forming a set of sidewall spacers on one set of sidewalls of the second linear structures, forming a first isolation pattern, the first isolation pattern comprising the first linear structures and the set of sidewall spacers, and transferring the first isolation pattern into the substrate base.

In another embodiment, a device structure may include a substrate base, the substrate base including an isolation pattern defining a two-dimensional array of fin structures. The two-dimensional array of fin structures may further comprise a set of linear trenches not exhibiting sidewall roughness, wherein a trench width of the set of linear trenches is 20 nm or less.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

Figure 1:
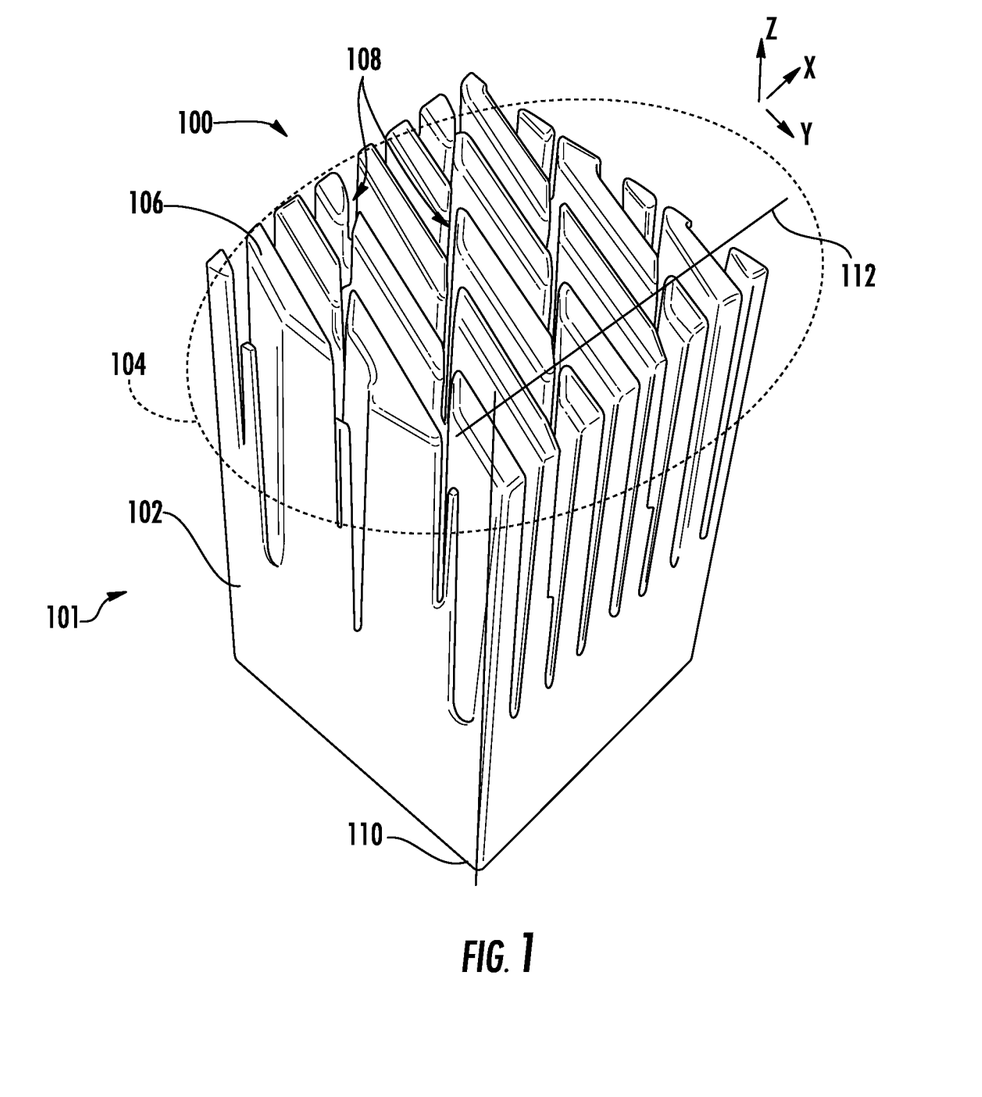
FIG. 1 shows a device structure, according to embodiments of the disclosure.

This present embodiments provide novel techniques and substrate structures to form devices, such as transistors, formed from semiconductor fin structures. These techniques may especially be applicable to formation of DRAM devices, while other devices may also be formed according to the embodiments of the disclosure. Various non-limiting embodiments are particularly useful for implementation where the width of fin structures or pitch between fin structures is less than 50 nm, and in some embodiments, 20 nm or less Turning now to FIG. 1 there is shown a device structure 100, according to embodiments of the disclosure. The device structure 100 is formed in a substrate base 102 of a substrate 101, where the substrate base may be monocrystalline silicon. The device structure is implemented within the substrate base 102, wherein the substrate base 102 includes an isolation pattern 104, defining a two-dimensional array of fin structures 106, where the two-dimensional array of fin structures 106 further comprises a set of linear trenches, trenches 108. According to various embodiments of the disclosure, the fin structures 106 are monolithically formed with the same material as the substrate base 102. In some embodiments, the fin structures 106 may exhibit an aspect ratio of 10/1, 15/1, or 20/1 where the numerator represents the trench height or fin height along the direction 110, normal to the plane (X-Y plane as shown) of the substrate. The denominator may represent the trench width of trenches 108, or alternatively the pitch between adjacent fins along the shortest direction 112 (parallel to the X-axis in this example). A hallmark of the device structure 100 is the narrow set of trenches, shown as trenches 108, where such trenches do not exhibit sidewall roughness and extend in a straight line, not exhibiting waviness, line width roughness or line edge roughness characteristic of known devices. In some examples, the trench width of trenches 108 may be 50 nm, 30 nm, 20 nm, or less, while the roughness of the trenches 108 may be 3 nm, 2 nm, 1 nm, or less. For example, known patterning techniques to generate structures such as trenches having nominal widths of 20 nm, 30 nm, or 50 nm, for example, may produce line edge roughness on the order of several nanometers, five nanometers, 10 nanometers, or more. Such levels of roughness may be unacceptable for generating arrays, such as arrays of fins having widths on the order of 10 nm, 20 nm, or 50 nm, and being separated by trenches having trench widths of 50 nm, 20 nm, 10 nm, or less. In this regard, the device structure 100 may be used to make transistors and arrays of devices, such as DRAM arrays, having superior properties, including devices having more uniformity in performance between devices, higher device yield, and so forth.

Figure 2A:
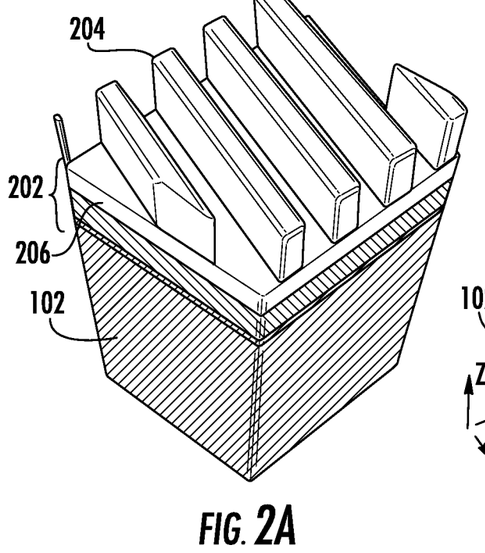
FIGS. 2A-2D depict an overview of one process of forming a device structure, according to embodiments of the disclosure.

FIGS. 2A-2D depict an overview of one process of forming of a device structure, according to embodiments of the disclosure. In FIG. 2A there is shown a substrate base 102, representing, for example, a silicon substrate. A patterning stack 202, formed of blanket layers of different patterning materials, is disposed on the substrate base 102. The patterning stack 202 may be formed from known materials, including for example, silicon oxide, silicon nitride, and carbon. The embodiments are not limited in this context. A patterned photoresist layer 204 is disposed on top of the patterning stack 202. The patterned photoresist layer 204 may be used to transfer a pattern into layers in the underlying device structure, including the patterning stack 202 and substrate base 102.

Figure 2B:
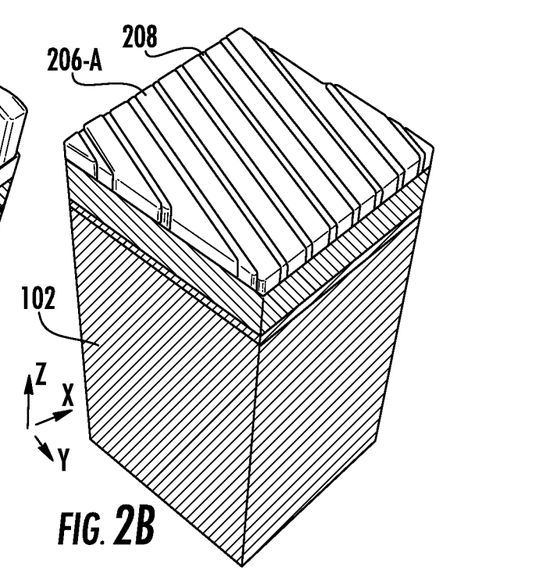

At FIG. 2B, the device structure is shown after a pattern reversal process, where a negative image of the patterned photoresist layer 204 is transferred into a top layer 206, which top layer 206 may be formed of a top layer material, such as a carbon layer in one embodiment. As detailed below, the pattern reversal may be accomplished by first etching the top layer 206 with the patterned photoresist layer present, to form a set of structures. Sidewalls may then be formed on the set of structures, and redeposition of material of the top layer 206 performed, followed by planarization to yield the structure of FIG. 2B. Thus, structure of FIG. 2B includes a first pattern of first linear structures 208, extending along a first direction (such as parallel to the Y-axis of the Cartesian coordinate system shown). The first linear structures 208 are interspersed with stripes 206-A, which regions may be formed of material from the top layer 206. The first linear structures 208 may be formed of oxide, nitride, or other material, and are arranged in an array of mutually parallel lines.

Figure 2C:
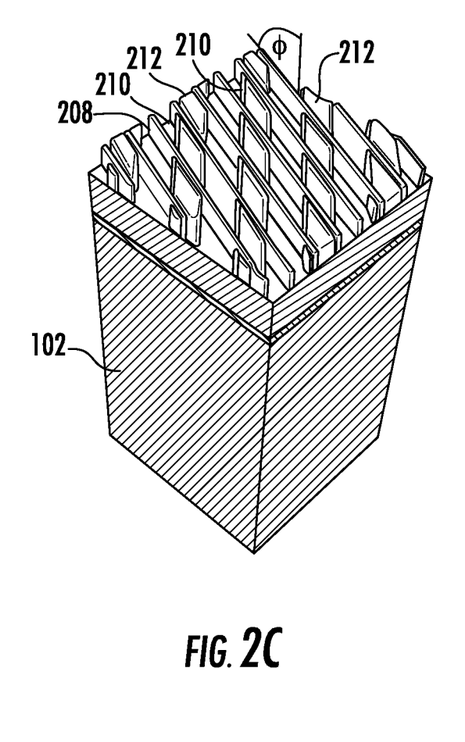

At FIG. 2C, the device structure is shown after further patterning to form a second pattern of second linear structures 212, where the second linear structures 212 form an array of mutually parallel lines, elongated along a second direction defining a non-zero angle☐☐ with respect to the first direction, within the X-Y plane, i.e., within the plane of the substrate 101. In some examples, the value of may range from to 1 to 89 degrees. The second linear structures 212 may be formed of material within the top layer 206. The second linear structures 212 may be formed by further lithographically patterning an additional mask layer, such as photoresist, and removal of portions of the top layer 206, to form the second linear structures 212 as shown. The second linear structures 212, oriented at the non-zero angle☐☐ with respect to the first linear structures of FIG. 2B, form chop structures, useful for defining a final, isolation pattern for patterning the substrate base 102. At this stage of processing in FIG. 2C, a set of sidewall spacers 210 is selectively formed on just one sidewall (left side in FIG. 2C) of the relatively wider, second linear structures 212. As detailed below, the set of sidewall spacers 210 may then be used to form narrow trenches isolating adjacent semiconductor fins in a final device structure, formed in the substrate base 102.

Figure 2D:
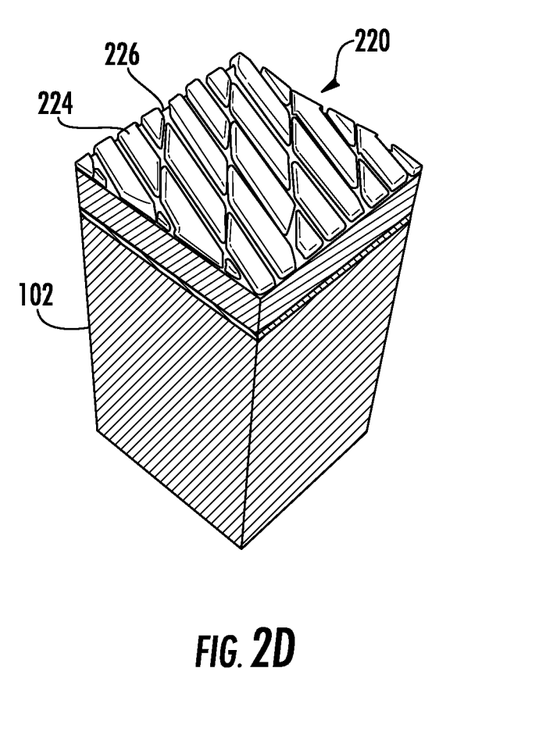

At FIG. 2D, the device structure is shown after filling of the structure of FIG. 2C with a fill material, and planarization so the fill material is arranged in a first isolation pattern 220 of islands to be transferred to the substrate base 102, below. In FIG. 2D, the first linear structures 208 and the set of sidewall spacers 210 have been removed. As such, the first isolation pattern 220 includes islands 224 separated by narrow, straight, trenches 226 (running vertically in FIG. 2D), defined by the set of sidewall spacers 210 of FIG. 2C. The structure of FIG. 2D may then be used to transfer the same pattern into the substrate base 102, to form an array of narrow semiconductor fin structures.

Figure 3A:
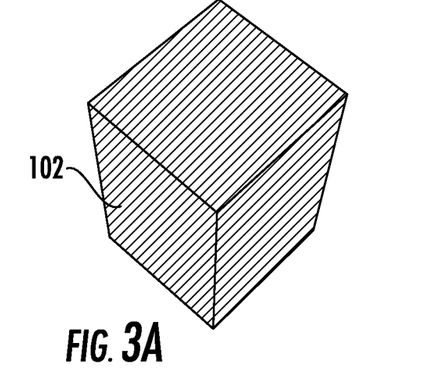
FIG. 3A to FIG. 3W depict exemplary operations involved in a method according to embodiments of the disclosure.
Figure 3B:
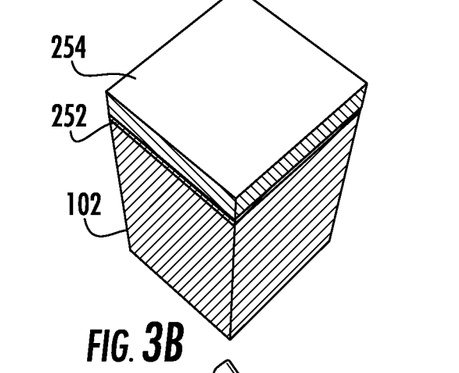
Figure 3C:
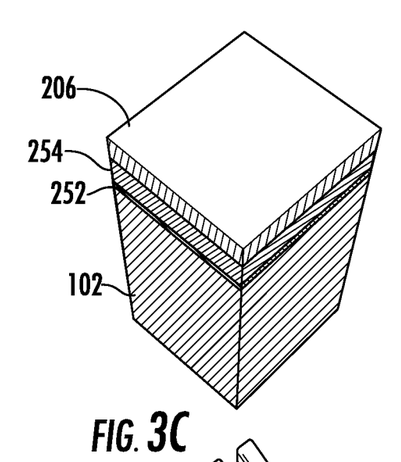
Figure 3D:
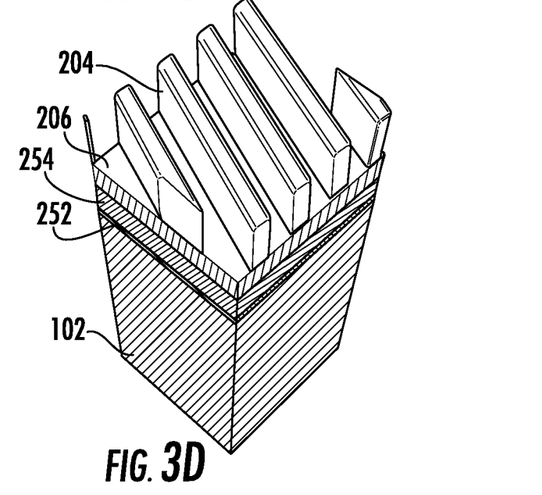

FIG. 3A to FIG. 3W depict exemplary operations involved in a method according to embodiments of the disclosure. At FIG. 3A, a substrate is provided, including a substrate base 102. The substrate base 102 may be a semiconductor such as monocrystalline silicon. At FIG. 3B, a layer 252 and a layer 254 are deposited, where the layer 252 may be a first material and the layer 254 may be a second material, such as silicon oxide and silicon nitride. At FIG. 3C, a top layer 206 is deposited, where the top layer 206 may differ in material from layer 254 and layer 256. As one example, the top layer 206 may be carbon or similar mask material. The top layer 206, layer 254 and layer 252 may form a patterning stack 202 to transfer a pattern to the substrate base 102. In some embodiments, a larger number of layers or fewer layers may be used as a patterning stack. At FIG. 3D, a patterned photoresist layer 204 is formed on top of the patterning stack 202.

Figure 3E:
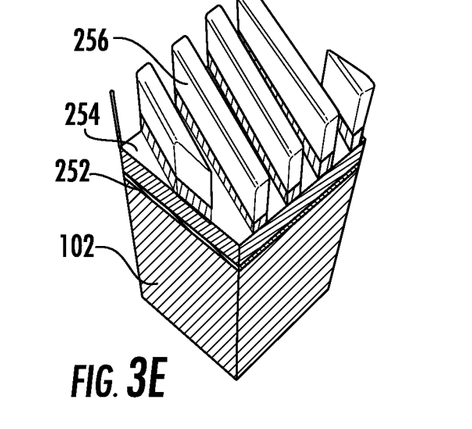

At FIG. 3E the pattern of the patterned photoresist layer 204 is transferred to the top layer 206, such as by anisotropic etching.

Figure 3F:
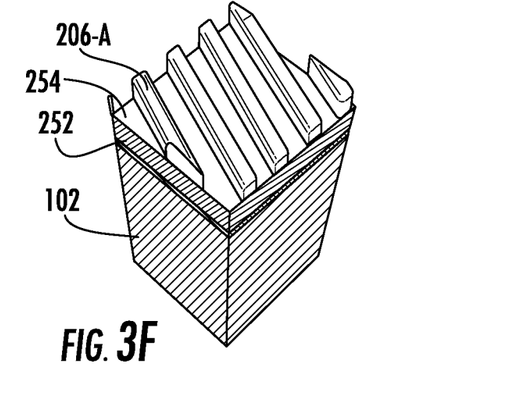
Figure 3G:
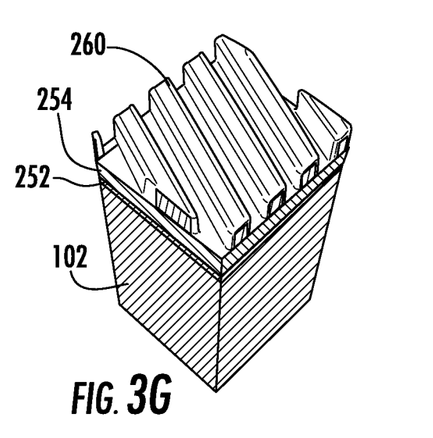
Figure 3H:
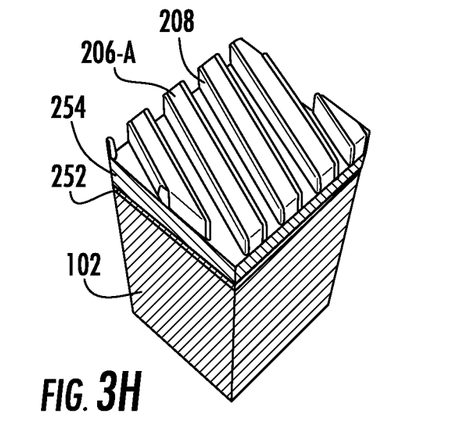
Figure 3I:
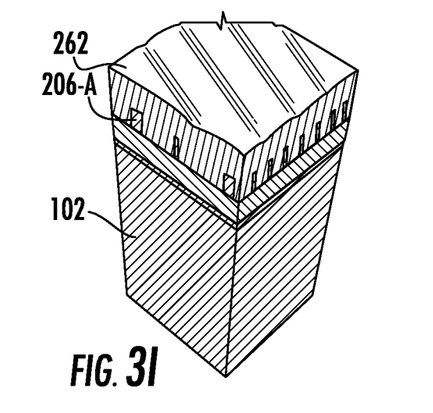
Figure 3J:
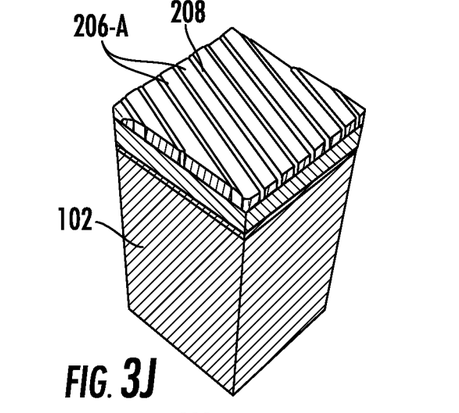
Figure 3K:
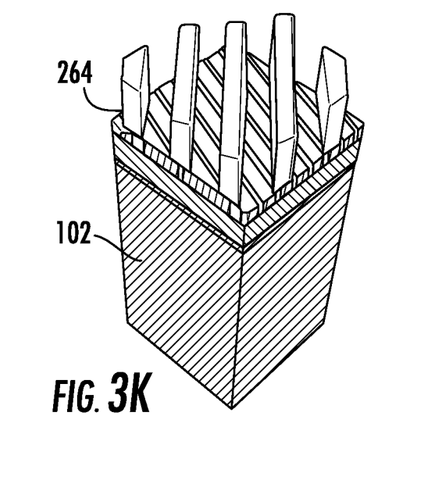
Figure 3L:
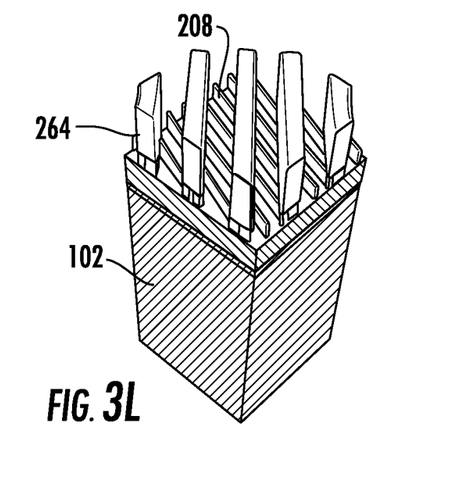

At FIG. 3F, the patterned photoresist layer 204 is removed, exposing the stripes 206-A. At FIG. 3G, a blanket layer 260 is deposited on the substrate, forming a coating over the stripes 206-A. At FIG. 3H, an etch process is performed to remove the blanket layer 260 from horizontal surfaces, leaving the first linear structures 208. At FIG. 3I, a blanket deposition of a layer 262 is performed. The layer 262 may be composed of the same material as top layer 206 in some embodiments. At FIG. 3J, a planarizing etch is performed, where the first linear structures 208 are exposed, with material, such as material of top layer 206, in the form of stripes 206-A, being interspersed between the first linear structures 208. At this instance, the device structure has undergone a pattern reversal from the structure of FIG. 3D. At FIG. 3K, a photoresist layer 264 is deposited and patterned to generate chop features in the underlying substrate. At FIG. 3L, material of the top layer 206 is selectively removed, exposing the first linear structures 208, as shown. For example, the top layer 206 may be composed of carbon and may be selectively removed by employing a known etchant recipe for ashing carbon, while not etching the first linear structures 208, which structures may be an oxide.

Figure 3M:
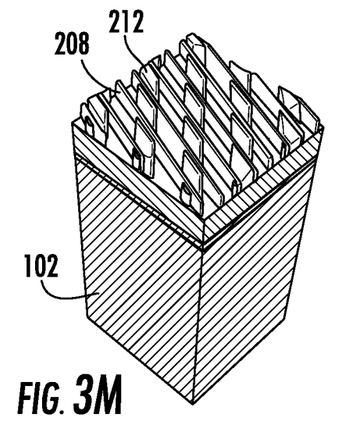
Figure 3N:
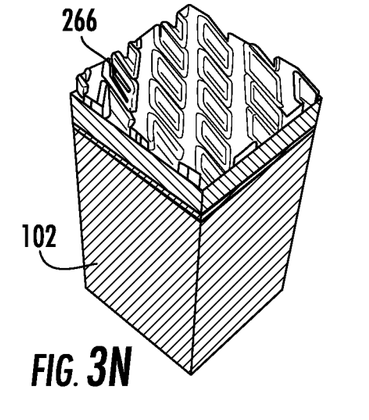

At FIG. 3M, the photoresist layer 264 is selectively removed, leaving a pattern of first linear structures 208 and second linear structures 212. At FIG. 3N a blanket sidewall layer 266 is deposited over the first linear structures 208 and the second linear structures 212. At FIG. 3O, an etch is performed to remove the blanket sidewall layer 266 in horizontal surfaces (parallel to the X-Y plane), leaving sets of sidewall spacers 268, disposed on pairs of sidewalls of the first linear structures 208 and disposed on pairs of sidewalls of the second linear structures 212. The etch may be a known reactive ion etch (RIE) process, targeted for spacer isolation.

Figure 3O:
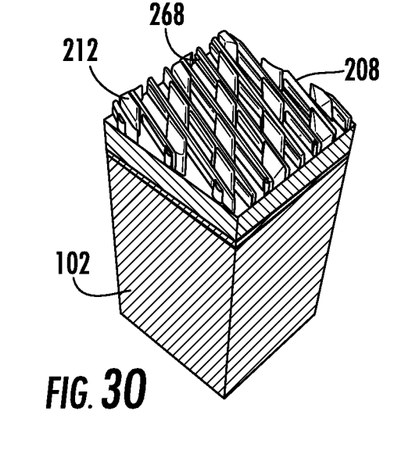
Figure 3P:
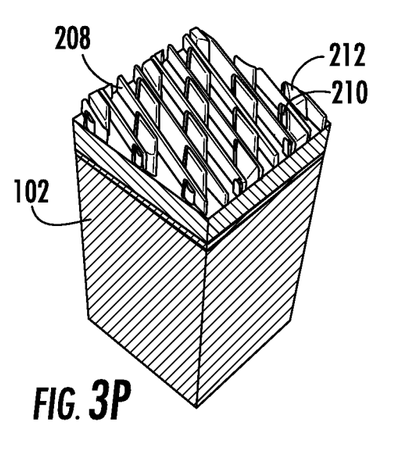

At FIG. 3P, the blanket sidewall layer 266 is selectively removed from a first set of sidewalls and a second set of sidewalls on the first linear structures 208 (running diagonally in the figure), and removed from a third set of sidewalls of the second linear structures 212. At this instance, a fourth set of sidewall spacers remains, shown as the set of sidewall spacers 210, discussed previously. As an example, while the second linear structures 212 may be formed of carbon or similar material, the set of sidewall spacers 210 and the first linear structures 208 may be formed of oxide, nitride, or other material. Notably, the first linear structures 208 may be formed of a different material than the set of sidewall spacers 210.

Figure 3Q:
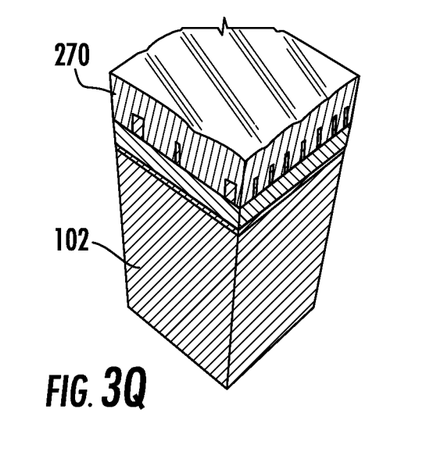

At FIG. 3Q, a blanket layer 270 is deposited, where the blanket layer 270 may be formed of a similar material or same material as top layer 206. In alternative embodiments, the material of blanket layer 270 may be filled either after removing previous material or by filling in spaces with material of the blanket layer 270.

Figure 3R:
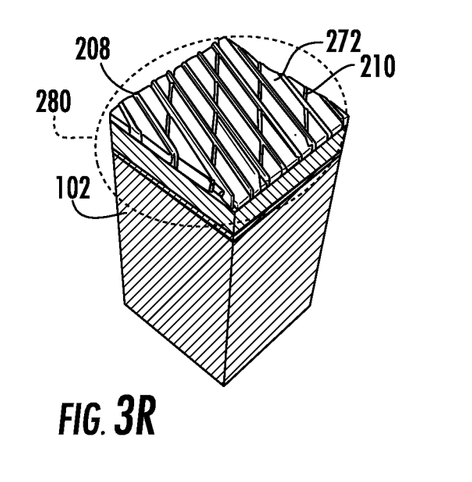

At FIG. 3R, a planarizing etch is performed, where the first linear structures 208 and the set of sidewall spacers 210 are exposed, with material, such as material of top layer 206 being interspersed between. The material of top layer 206 is isolated into fill islands 272, as shown. As such, the fill islands 272, set of sidewall spacers 210, and first linear structures 208 define a first isolation pattern 280, to be transferred into the substrate base 102.

Figure 3S:
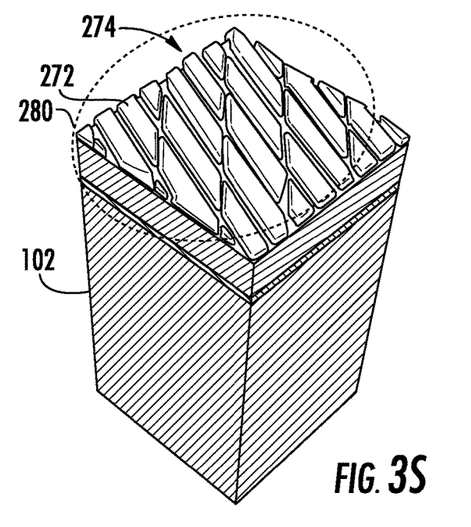
Figure 3T:
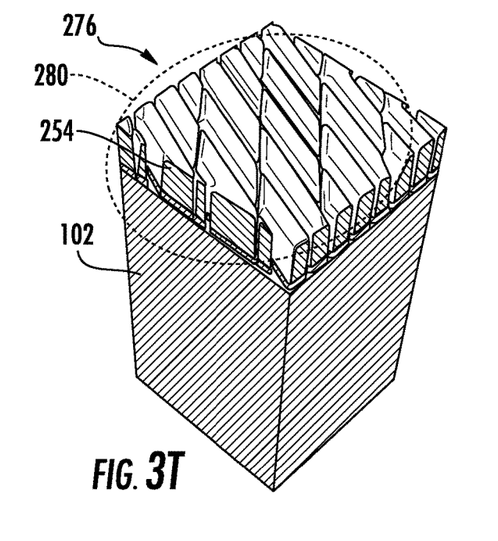

At FIG. 3S, the first linear structures 208 and the set of sidewall spacers 210 are selectively removed leaving an array 274 of fill islands 272 defining the first isolation pattern 280. The selective removal of the first linear structures 208 and the set of sidewall spacers 210 may be accomplished by any convenient selective etchant appropriate for the material(s) of the set of sidewall spacers 210 and first linear structures 208. At FIG. 3T, the first isolation pattern 280 is transferred into underlying layers of the patterning stack 202, such as oxide layers or nitride layers. The transfer may be accomplished by known etchant recipes, such as anisotropic etchant recipes. At this stage, material of top layer 206 has been removed, and the first isolation pattern 280 is embodied in islands 276, formed in the layer 252 and layer 254.

Figure 3U:
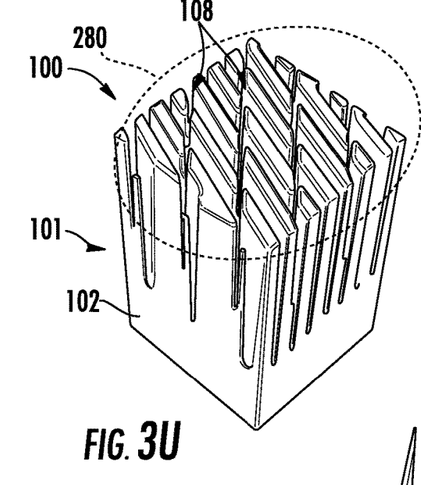
Figure 3V:
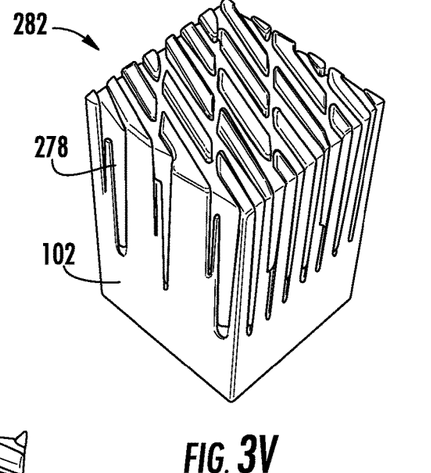

At FIG. 3U, the substrate base 102 has been etched with the islands 276 in place, transferring the first isolation pattern 280 into the substrate base 102. The final implementation of the first isolation pattern 280 within the substrate 101 is defined by isolated semiconductor fin structures, as shown, separated by deep and narrow trenches, as discussed above with respect to FIG. 1. At FIG. 3V, insulator 278 is introduced into trenches between semiconductor fin structures, forming a trench isolation structure 282. At FIG. 3W, a device structure 290 is shown, where gates 286 are formed in trench regions derived from the structure of FIG. 3V.

Figure 3W:
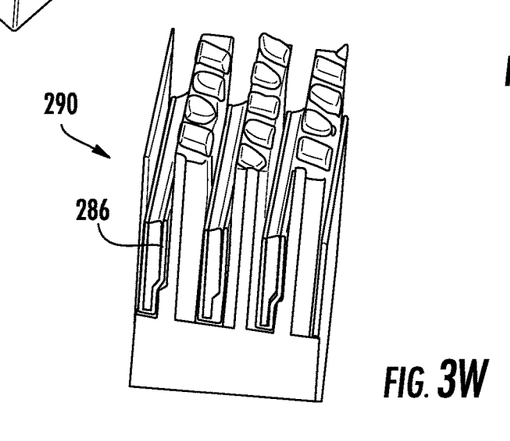

A hallmark of the method shown in FIGS. 3A-3W is the formation of narrow and straight trenches using the set of sidewall spacers 210. Because the set of sidewall spacers 210 is formed on the second linear structures 212, the set of sidewall spacers 210 may inherit properties from the second linear structures 212. Advantageously, the second linear structures 212 may have much larger widths than the set of sidewalls spacers 210. The second linear structures 212, having relatively larger dimension, may be defined using known, high throughput, lithographic processes, such as deep ultraviolet lithography. For example, the width of the second linear structures 212 may be 30 nm, 50 nm, or larger, and the pitch between adjacent one of the second linear structures 212 may be still larger. As such, the second linear structures 212 may be formed without line edge roughness and linewidth roughness effects, often associated with processes used to scale down features. Notably, the width of the set of sidewall spacers 210 may be conveniently defined by the thickness of the blanket sidewall layer 266. Thus, a sidewall spacer of the set of sidewall spacers 210 may readily be formed by depositing a blanket layer of similar thickness. Moreover, because the second linear structures 212 may have straight sidewalls (as defined in the X-Y plane), the set of sidewall spacers 210 may also extend in a straight line, as shown in FIG. 3R.

To perform the operation generally shown at FIG. 3P, according to some embodiments, a substrate may be placed in a process chamber of an apparatus including an adjacent plasma chamber. To selectively etch sidewall spacer material from both sidewalls of the first linear structures 208 and from one set of sidewalls of the second linear structures 212, a directional ion beam may be extracted from the plasma chamber, as detailed below. The directional ion beam may be extracted from the plasma chamber into the process chamber through an extraction aperture, defining the size and shape of the ion beam. In particular embodiments, the ion beam forms a trajectory defining a non-zero angle of incidence with respect to normal to the substrate plane, as explained below. This geometry allows the ion beam to be directed in a targeted manner to select sidewalls, while leaving other sidewalls unimpacted by the ion beam.

Figure 4A:
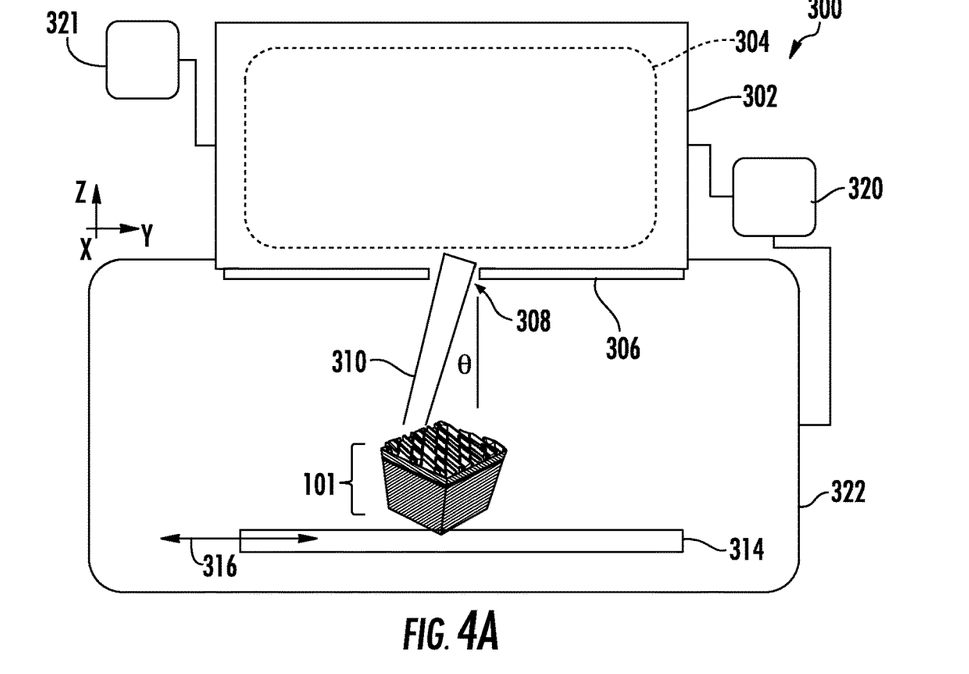
FIG. 4A, FIG. 4B and FIG. 4C show a side view and a top view, respectively, of a processing apparatus according to embodiments of the disclosure.

Turning now to FIG. 4A, there is shown a processing apparatus 300, depicted in schematic form. The processing apparatus 300 represents a processing apparatus for selectively etching portions of a substrate, such as sidewalls. The processing apparatus 300 may be a plasma based processing system having a plasma chamber 302 for generating a plasma 304 therein by any convenient method as known in the art, such as using power supply 321. An extraction plate 306 may be provided as shown, having an extraction aperture 308, where a selective etching may be performed to selectively remove sidewall layers. A substrate, such as a substrate 101 having the aforementioned structure as shown at FIG. 3O, is disposed in the process chamber 322. A substrate plane of the substrate 101 is represented by the X-Y plane of the Cartesian coordinate system shown, while a perpendicular to the plane of the substrate 101 lies along the Z-axis (Z-direction).

During a selective etching operation, an ion beam 310 is extracted through the extraction aperture 308 as shown. The ion beam 310 may be extracted when a voltage difference is applied using bias supply 320 between the plasma chamber 302 and substrate 101 as in known systems. The bias supply 320 may be coupled to the process chamber 322, for example, where the process chamber 322 and substrate 101 are held at the same potential. In various embodiments, the ion beam 310 may be extracted as a continuous beam or as a pulsed ion beam as in known systems. For example, the bias supply 320 may be configured to supply a voltage difference between plasma chamber 302 and process chamber 322, as a pulsed DC voltage, where the voltage, pulse frequency, and duty cycle of the pulsed voltage may be independently adjusted from one another.

Figure 4B:
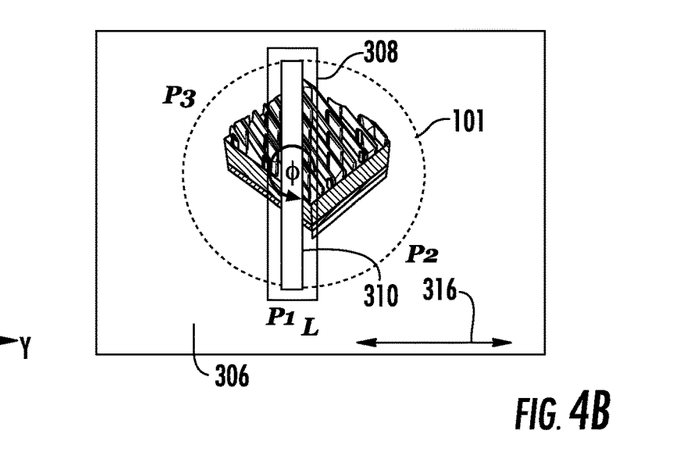

By scanning a substrate stage 314 including substrate 101 with respect to the extraction aperture 308, and thus with respect to the ion beam 310 along the scan direction 316, the ion beam 310 may etch a set of sidewall spacers, where the set of sidewall spacers are oriented, for example, perpendicularly to the scan direction 316, as further shown in FIG. 4B. In various embodiments, for example, the ion beam 310 may be provided as a ribbon ion beam having a long axis extending along the X-direction of the Cartesian coordinate system shown in FIG. 4B. The substrate 101 may be arranged, for example, where one set of sidewalls of the second linear structures 212 is exposed to the beam. For example, the second linear structures 212 may be oriented with the long direction parallel to the long axis of the extraction aperture, along the X-axis. In this manner, as shown in FIG. 4A, the ion beam 310, forming a non-zero angle of incidence with respect to the Z-axis (normal to the substrate plane), may strike the right sidewalls of the second linear structures 212, removing the sidewall spacers. The ion beam 310 may be composed of any convenient gas mixture, including inert gas, reactive gas, and may be provided in conjunction with other gaseous species in some embodiments. In particular embodiments, the ion beam 310 and other reactive species may be provided as an etch recipe to the substrate 101 so as to perform a directed reactive ion etching of targeted sidewalls of the substrate 101. The etch recipe may be selective with respect to the material of second linear structures 212, so as to remove the blanket sidewall layer 266, while not etching the second linear structures 212, or etching the second linear structures 212 to a lesser extent.

In this example of FIG. 4B, the substrate 101 is a circular wafer, such as a silicon wafer, the extraction aperture 308 is an elongated aperture, having an elongated shape. The ion beam 310 is provided as a ribbon ion beam extending to a beam width along the X-direction, where the beam width is adequate to expose an entire width of the substrate 101, even at the widest part along the X-direction. Exemplary beam widths may be in the range of 10 cm, 20 cm, 30 cm, or more while exemplary beam lengths along the Y-direction may be in the range of 3 mm, 5 mm, 10 mm, or 20 mm. The embodiments are not limited in this context.

As also indicated in FIG. 4B, the substrate 101 may be scanned in the scan direction 316, where the scan direction 316 lies in the X-Y plane, such as along the Y-direction. Notably, the scan direction 316 may represent the scanning of substrate 101 in two opposing (180 degrees) directions along the Y-direction, or just a scan toward the left or a scan toward the right. As shown in FIG. 4B, the long axis of ion beam 310 extends along the X-direction, perpendicularly to the scan direction 316. Accordingly, an entirety of the substrate 101 may be exposed to the ion beam 310 when scanning of the substrate 101 takes place along a scan direction 316 to an adequate length from a left side to right side of substrate 101 as shown in FIG. 4B.

As also shown in FIG. 4B, the exposure of substrate 101 to the ion beam 310 may take place when the substrate 101 is scanned while disposed at a first rotational position as indicated by the position P1 on substrate 101 being located under the location L on the extraction plate 306. For example, the position P1 may correspond to the position of a notch or a flat on a wafer. In accordance with various embodiments, a plurality of scans may be performed to selectively remove sidewall spacers from different sidewalls, where the substrate 101 may be rotated through a plurality of different rotational positions, as noted. For example, the position P2 may represent a position on a radius of substrate 101 rotated at a given twist angle, such as the non-zero angle□□ defined with respect to the angle between the second linear structures 212 and first linear structures 208 of FIG. 2C.

Accordingly, in the substrate 101 may be rotated with respect to a perpendicular or a perpendicular plane to the X-Y plane, through a twist angle of 30 degrees with respect to the rotational position of FIG. 4B. Processing of the substrate 101 in this second rotational position may proceed similarly to processing in the rotational position of FIG. 4B, where the substrate 101 is again scanned along the scan direction 316 to expose an entirety of substrate 101 to the ion beam 310 in a second scan. This second operation in the second rotational position may expose a set of sidewall spacers on one sidewall of the first linear structures 208 to the ion beam 310, so as to selectively etch the sidewalls. In a further operation, the substrate 101 may be rotated with respect to a perpendicular or to the X-Y plane, through a twist angle of 180 degrees with respect to the second rotational position, to position P3. In this manner, the opposite sidewalls of the first linear structures may be exposed to the ion beam 310. In the above process, a blanket sidewall layer, initially forming sidewall spacers on the first linear structures 208 and the second linear structures 212, may be removed from a first set of sidewalls, second set of sidewalls, and third set of sidewalls, with just the set of sidewall spacers 210 remaining.

Figure 4C:
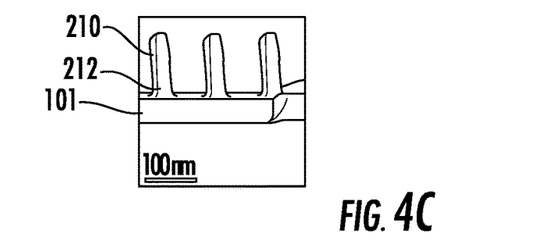

In targeted experiments the results of selective removal of a blanket sidewall layer from one example of the second linear structures 212, was studied in accordance with an embodiment of the disclosure. FIG. 4C shows a sample electron micrograph depicting exemplary results. The results obtained included cross-sectional electron microscopy, showing a set of sidewall spacers 210, remaining after the substrate 101 was exposed to scanning to remove sidewall layer material from the right sidewalls. A group of the second linear structures 212 in the experimental results extended approximately 120 nm in height and 25 nm in width, while the width of the set of sidewall spacers 210 was approximately 10 nm. As observed, sidewall spacers were completely removed from the right sidewalls, while the set of sidewall spacers 210 extends nearly to the tops of the second linear structures 212.

In accordance with various embodiments, the processing apparatus 300 may be employed in additional operations of the method of FIGS. 3A-3W. In various embodiments, the planarization operation of FIG. 3J, the planarization operation of FIG. 3R, or the two planarization operations, may be performed using processing apparatus 300. A given planarization operation may entail scanning the substrate 101 through a plurality of scans while exposed to an ion beam, where the substrate 101 is rotated through a designed twist angle to a new rotational position between scans. In some examples, an a given planarization operation may comprise 4 scans, 6 scans, 8 scans, or more. The embodiments are not limited in this context. The different scans of a planarization operation may be tuned so as to planarize the substrate 101 to achieve a target planarity. For example, the substrate 101 may be measured using known techniques to provide a two-dimensional thickness map before a planarization operation, so the amount of material of top layer 206, for example is removed according to the initial thickness at each point on the two-dimensional map. Thus, the planarization operation may in some cases involve a series of scans at different twist angles, where the series of scans together generate a non-uniform etch pattern in the X-Y plane, where the thickness of the given substrate layer after the planarization is more uniform than before the planarization. An advantage of using a scanned ion beam to perform these planarization operations as opposed to chemical mechanical polishing (CMP), or other known planarization techniques, is the lesser overburden of a blanket layer to be planarized needed. In CMP, the overburden may often be three to four times the thickness of the final layer to be planarized, leading to a lengthy process. Additionally, for removing thinner layers of material, CMP is more difficult to control and relatively expensive, as opposed to a scanned ion beam, where material removal is on an atomic level.

Figure 5:
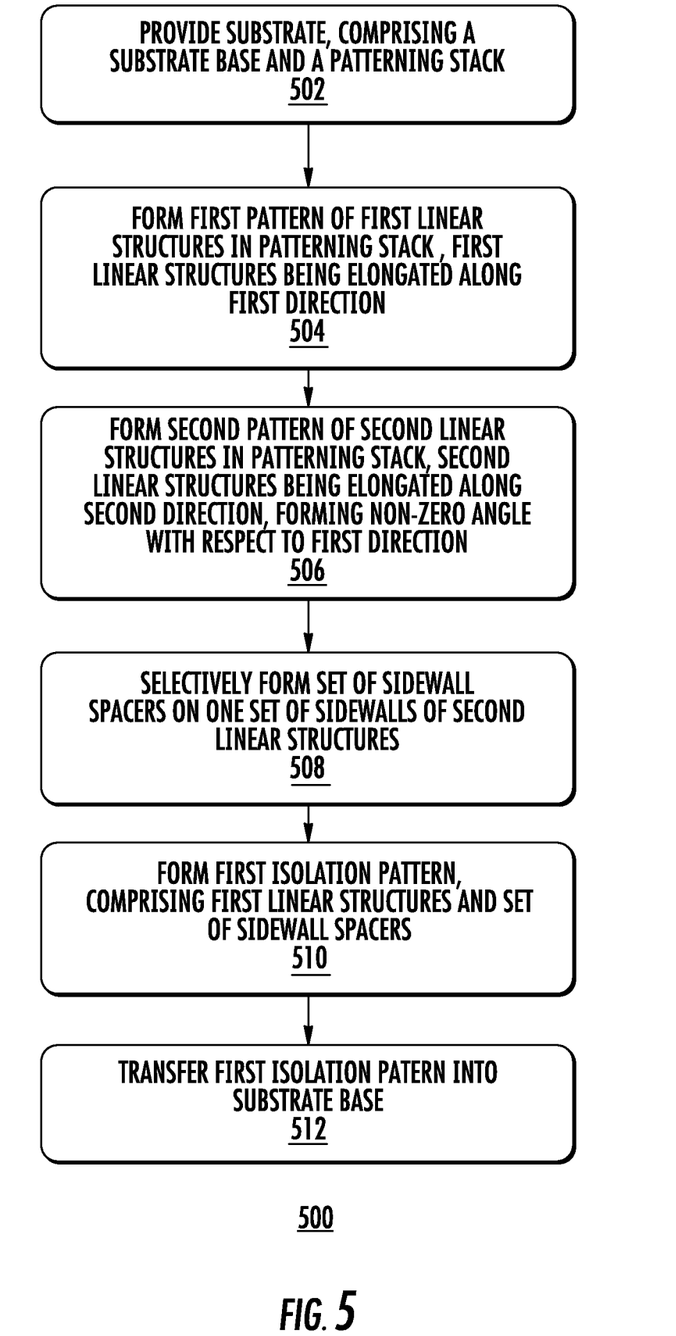
FIG. 5 presents an exemplary process flow according to an embodiment of the disclosure.

FIG. 5 depicts an exemplary process flow 500, according to embodiments of the disclosure. At block 502, a substrate is provided. The substrate may include a substrate base and a patterning stack, disposed on the substrate base. In various embodiments, the substrate base may be a monocrystalline semiconductor, while the patterning stack includes different layers, such as oxide, nitride, carbon, carbide, and so forth.

At block 504, a first pattern of first linear structures is formed in the patterning stack, where the first linear structures being elongated along a first direction. The first linear structures may constitute an array of parallel lines formed of at least one layer of the patterning stack. In some examples, the first linear structures may be formed from sidewalls of linear precursor structures.

At block 506, a second pattern of second linear structures is formed in the patterning stack. The second linear structures may be elongated along a second direction, forming a non-zero angle with respect to the first direction.

At block 508, a set of sidewall spacers is selectively formed on one set of sidewalls of the second linear structures. In some embodiments, the set of sidewall structures are formed by depositing a blanket sidewall layer over the first linear structures and the second linear structures, then selectively removing the blanket sidewall layer from both sidewalls of the first linear structures and one sidewall of the second linear structures.

At block 510, a first isolation pattern is formed, comprising the first linear structures and the set of sidewall spacers. At block 512, the first isolation pattern is transferred into the substrate base. This transfer may be accomplished by a series of etch operations.

The present embodiments provide various advantages over known processing to form devices such as arrays of semiconductor structures for forming DRAM transistors. For one advantage, adjacent fin structures may be more closely spaced to one another because the trenches separating the adjacent fin structures are defined by sidewall spacers having controllable widths down to 10 nm, 7 nm, 5 nm, or less. For another advantage, the uniformity of spacing between adjacent fin structures may be much improved because the trenches defining the spacing are derived from straight sidewall spacers, i.e., precursor sidewall spacers, formed on relatively thicker, linear precursor structures. Thus, another advantage of the present embodiments is the ability to form narrow trenches in isolation structures using relatively high throughput and less challenging deep ultra-violet lithography to define the isolation pattern. Another advantage of the present embodiments is because the straight sidewall fin structures generate a greater surface area than rounded features of known fin structures. A greater area of silicon is better for device functionality, since greater silicon surface area leads to more surface for electrons, as well as a larger contact area to reduce contact resistance. A further advantage of the present embodiments in the improved resolution and overlay accomplished by use of selective spacer formation.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A device structure, comprising:
a substrate base, the substrate base including an isolation pattern defining a two-dimensional array of fin structures, wherein the two-dimensional array of fin structures is a same homogeneous material as the substrate base, wherein the two-dimensional array of fin structures further comprises a first set of linear trenches and a second set of linear trenches each not exhibiting sidewall roughness, wherein a trench width of the first and second sets of linear trenches is 20 nm or less, wherein the first set of linear trenches extends in a first direction, wherein the second set of linear trenches extends in a second direction, wherein the first direction intersects the second direction, wherein a first depth of the first set of linear trenches is greater than a second depth of the second set of linear trenches, wherein a first width of the first set of linear trenches is greater than a second width of the second set of linear trenches, and wherein a top surface of a first plurality of fin structures of the two-dimensional array of fin structures defining the first set of linear trenches is coplanar with a top surface of a second plurality of fin structures of the two-dimensional array of fin structures defining the second set of linear trenches.

2. The device structure of claim 1,
wherein an angle formed between the first direction and the second direction is between 1 and 89 degrees, wherein the first and second sets of linear trenches have an aspect ratio having a value of 15 or more, and wherein the aspect ratio equals a trench depth divided by the trench width.

3. A semiconductor device, comprising:
a substrate base comprising a two-dimensional array of fin structures separated by linear trenches, wherein the two-dimensional array of fins structures is a same homogeneous material as the substrate base, wherein the linear trenches comprises:
a first set of linear trenches formed in the substrate base, the first set of linear trenches extending in a first direction, wherein the first set of linear trenches has a first depth and a first width; and
a second set of linear trenches formed in the substrate base, the second set of linear trenches extending in a second direction, wherein the first direction intersects the second direction, wherein an angle formed between the first direction and the second direction is greater than 0 degrees and less than 90 degrees, wherein a trench width of the linear trenches is 20 nm or less; wherein the second set of linear trenches has a second depth and a second width, wherein the first depth is greater than the second depth, wherein the first width is greater than the second width, and wherein a top surface of a first plurality of fin structures of the two-dimensional array of fin structures defining the first set of linear trenches is coplanar with a top surface of a second plurality of fin structures of the two-dimensional array of fin structures defining the second set of linear trenches; and an insulator formed in the linear trenches.

4. The semiconductor device of claim 3, wherein the first and second sets of linear trenches of the two-dimensional array of fin structures comprises an aspect ratio having a value of 15 or more, and wherein the aspect ratio equals a trench depth divided by the trench width.

5. The semiconductor device of claim 3, further comprising a set of gates formed in trench regions of the two-dimensional array of fin structures.

6. The semiconductor device of claim 3, wherein the
first set of linear structures form a first array of mutually parallel lines and wherein the second set of linear structures form a second array of mutually parallel lines, and wherein the first array of mutually parallel lines are oriented at a non-zero angle with respect to the second array of mutually parallel lines.

7. The semiconductor device of claim 6, wherein the non-zero angle is less than 90 degrees.

8. The semiconductor device of claim 3, wherein the insulator is recessed below a top surface of the two-dimensional array of fin structures.

9. A trench isolation structure, comprising:
a substrate base comprising a two-dimensional array of fin structures separated by a first set of linear trenches and a second set of linear trenches, the first set of linear trenches extending in a first direction and the second set of linear trenches extending in a second direction, wherein the first direction intersects the second direction, wherein an angle formed between the first direction and the second direction is greater than 0 and less than 90 degrees, wherein a trench width of the first set of linear trenches is greater than a trench width of the second set of linear trenches, wherein a trench depth of the first set of linear trenches is greater than a trench depth of the second set of linear trenches, wherein the two-dimensional array of fin structures is a same homogeneous material as the substrate base, and wherein a top surface of a first plurality of fin structures of the two-dimensional array of fin structures defining the first set of linear trenches is coplanar with a top surface of a second plurality of fin structures of the two-dimensional array of fin structures defining the second set of linear trenches; and an insulator formed in the first and second sets of linear trenches.

10. The trench isolation structure of claim 9, wherein the first and second sets of linear trenches of the two-dimensional array of fin structures each comprises an aspect ratio having a value of 15 or more, and wherein the aspect ratio equals a trench depth divided by the trench width.

11. The trench isolation structure of claim 9, further comprising a set of gates formed in trench regions.

12. The trench isolation structure of claim 9, wherein the
first set of linear structures form a first array of mutually parallel lines and wherein the second set of linear structures form a second array of mutually parallel lines, and wherein the first array of mutually parallel lines are oriented at a non-zero angle with respect to the second array of mutually parallel lines.

13. The trench isolation structure of claim 12, wherein the non-zero angle is less than 90 degrees.

14. The trench isolation structure of claim 9, wherein the insulator is recessed below a top surface of the two-dimensional array of fin structures.

\* \* \* \* \*